(12) United States Patent
Piao et al.

(10) Patent No.: US 12,499,851 B2
(45) Date of Patent: Dec. 16, 2025

(54) BUFFER AND A DATA DRIVING DEVICE

(71) Applicant: LX SEMICON CO., LTD., Daejeon (KR)

(72) Inventors: Tai Ming Piao, Daejeon (KR); Won Kim, Daejeon (KR); Jin Woo Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 18/795,572

(22) Filed: Aug. 6, 2024

(65) Prior Publication Data

US 2025/0054458 A1 Feb. 13, 2025

(30) Foreign Application Priority Data

Aug. 9, 2023 (KR) .......................... 10-2023-0104124

(51) Int. Cl.
*G09G 3/36* (2006.01)

(52) U.S. Cl.
CPC ..... *G09G 3/3688* (2013.01); *G09G 2310/027* (2013.01); *G09G 2310/0291* (2013.01); *G09G 2320/0276* (2013.01)

(58) Field of Classification Search
CPC ............... G09G 3/3685; G09G 3/3688; G09G 2310/027; G09G 2310/0291; G09G 2320/0276
See application file for complete search history.

(56) References Cited

U.S. PATENT DOCUMENTS

| | | | |
|---|---|---|---|
| 7,142,055 B2 * | 11/2006 | Inokuchi | H03F 3/45219 330/69 |
| 10,418,946 B2 * | 9/2019 | Lin | H03F 3/21 |
| 11,527,193 B2 * | 12/2022 | Kim | G09G 3/2092 |
| 11,641,199 B2 * | 5/2023 | Sul | H03F 3/45179 327/108 |
| 11,799,431 B2 * | 10/2023 | Jeong | H03F 3/45192 |
| 2004/0100318 A1 * | 5/2004 | Lim | H03K 3/356156 327/333 |
| 2022/0200555 A1 * | 6/2022 | Jeong | H03F 3/45219 |
| 2022/0208123 A1 | 6/2022 | Kim et al. | |
| 2023/0037207 A1 | 2/2023 | Hong | |

FOREIGN PATENT DOCUMENTS

| KR | 10-2022-0093787 A | 7/2022 |
|---|---|---|
| KR | 10-2023-0018042 A | 2/2023 |

* cited by examiner

*Primary Examiner* — Gene W Lee
(74) *Attorney, Agent, or Firm* — ROTHWELL, FIGG, ERNST AND MANBECK, P.C.

(57) ABSTRACT

A buffer can include a first output adjustment unit configured to output a first signal, and a second output adjustment unit configured to output a second signal. The first output adjustment unit can include a first input stage configured to adjust a control current according to a difference between a first input voltage and a first output voltage, and a first output stage configured to output the first output voltage as the first signal. The first output voltage can be a voltage between a first level voltage and a second level voltage. The first input stage can be connected to a third power line that supplied a third level voltage. The first level voltage can be greater than the second level voltage. The second level voltage can be greater than the third level voltage.

20 Claims, 13 Drawing Sheets

BUFFER AND A DATA DRIVING DEVICE

CROSS-REFERENCE TO RELATED APPLICATIONS

The present application claims the benefits of priority to Korean Patent Application No. 10-2023-0104124, filed on Aug. 9, 2023, the entire contents of which are hereby expressly incorporated by reference into the present application.

BACKGROUND OF THE DISCLOSURE

Field

The embodiment relates to a buffer and a data driving device.

Discussion of the Related Art

A display device is generally equipped with a data driving device for supplying a data signal to a panel.

When a data signal is supplied to a data line provided on the panel, there is a problem that the data signal is distorted due to a load component caused by the data line. To solve this problem, a channel buffer is provided that amplifies and outputs the data signal for a channel corresponding to the data line.

However, a random offset occurs due to a random mismatch between elements within the channel buffer. In particular, the random offset occurs significantly when the input voltage or the output voltage of the channel buffer approaches the minimum level voltage or the maximum level voltage supplied to the channel buffer.

Various methods have been suggested to solve this problem, such as optimizing the element layout or increasing the element size. However, the occurrence of the random offset has not yet been solved.

Meanwhile, linearity of the gain characteristic is very important for smooth operation of the buffer. That is, an ideal buffer should maintain perfect linearity for gain characteristics. However, no prior art has been proposed yet to resolve linearity for gain characteristics.

SUMMARY OF THE DISCLOSURE

An object of the embodiment is to solve the foregoing and other problems.

Another object of the embodiment is to provide a buffer and a data driving device capable of improving random offset.

Another object of the embodiment is to provide a buffer and a data driving device capable of improving linearity.

The technical problems of the embodiments are not limited to those described in this item and comprise those that can be understood through the description of the invention.

In order to achieve the above or other objects, according to the first aspect of the embodiment, a buffer, comprising: a first output adjustment unit configured to output a first signal; and a second output adjustment unit configured to output a second signal, wherein the first output adjustment unit comprises: a first input stage configured to adjust a control current according to a difference between a first input voltage and a first output voltage; and a first output stage configured to output the first output voltage as the first signal, wherein the first output voltage is a voltage between a first level voltage and a second level voltage, wherein the first input stage is connected to a third power line that supplied a third level voltage, wherein the first level voltage is greater than the second level voltage, and wherein the second level voltage is greater than the third level voltage.

The first output stage can comprise a first side connected to a first power line that supplies the first level voltage, and a second side connected to a second power line that supplies the second level voltage.

The first input stage can comprise a first conductivity type transistor and a second conductivity type transistor. A second electrode of the first conductivity type transistor and a second electrode of the second conductivity type transistor can be respectively connected to a second node and a first node for controlling the pull-up operation. A third electrode of the first conductivity type transistor and a third electrode of the second conductivity type transistor can be connected to the third power line.

One of a first electrode of the first conductivity type transistor and a first electrode of the second conductivity type transistor can be input with the first input voltage. The other of the first electrode of the first conductivity type transistor and the first electrode of the second conductivity type transistor can be input with the first output voltage.

The first input voltage or the first output voltage can be greater than the second level voltage.

The first conductivity type transistor and the second conductivity type transistor can comprise NMOS transistors.

A second difference value between the second level voltage and the third level voltage can be greater than or equal to a first difference value between the first level voltage and the second level voltage.

The second output adjustment unit can comprise a second input stage configured to adjust a control current according to a difference between a second input voltage and a second output voltage, and a second output stage configured to output the second output voltage as the second signal. The second output voltage can be a voltage between the second level voltage and the third level voltage, and the second input stage can be connected to a first power line that supplies the first level voltage.

The second output stage can comprise a first side connected to a second power line that supplies the second level voltage, and a second side connected to the third power line that supplies the third level voltage.

The second input stage can comprise a third conductivity type transistor and a fourth conductivity type transistor. A second electrode of the third conductivity type transistor and a second electrode of the fourth conductivity type transistor can be respectively connected to a third node and a fourth node for controlling the pull-down operation. A third electrode of the third conductivity type transistor and a third electrode of the fourth conductivity type transistor can be connected to the first power line.

One of the first electrode of the third conductivity type transistor and the first electrode of the fourth conductivity type transistor can be input with the second input voltage. The other of the first electrode of the third conductivity type transistor and the first electrode of the fourth conductivity type transistor can be input with the second output voltage.

The second input voltage or the second output voltage can be smaller than the second level voltage.

The third conductivity type transistor and the fourth conductivity type transistor can comprise PMOS transistors.

A first difference value between the first level voltage and the second level voltage can be greater than or equal to a second difference value between the second level voltage and the third level voltage.

According to the second aspect of the embodiment to achieve the above or other purposes, a data driving device, comprising: a digital-to-analog converter configured to convert digital data into an analog data signal; and an output buffer unit comprising a buffer for each output channel to buffer and output the analog data signal, wherein the output buffer unit comprises: a first output adjustment unit configured to output a first signal; and a second output adjustment unit configured to output a second signal, wherein the first output adjustment unit comprises: a first input stage configured to adjust a control current according to a difference between a first input voltage and a first output voltage; and a first output stage configured to output the first output voltage as the first signal, wherein the first output voltage is a voltage between a first level voltage and a second level voltage, wherein the first input stage is connected to a third power line that supplies a third level voltage, wherein the first level voltage is greater than the second level voltage, and wherein the second level voltage is greater than the third level voltage.

According to the third aspect of the embodiment to achieve the above or other purposes, a data driving device, comprising: a gamma voltage circuit comprising a plurality gamma buffers, each of which buffers and outputs a plurality reference gammas; a digital-to-analog converter configured to convert digital data into an analog data signal based on the plurality of reference gammas; and an output buffer unit comprising a channel buffer for each output channel to buffer and output the analog data signal. The gamma buffer and the channel buffer may comprise the buffer according to the first aspect of the embodiment.

The effects of the buffer and the data driving device according to the embodiment are described as follows.

In the embodiment, the buffer may be a channel buffer connected to an output terminal of the digital-to-analog converter or a gamma buffer connected to an input terminal of the digital-to-analog converter.

In the embodiment, the display panel may be a liquid crystal display panel. The liquid crystal display panel may be supplied with positive data signals and negative data signals to adjacent data lines or supplied alternately every cycle.

For example, the channel buffer may comprise a first channel buffer that outputs a positive data signal and a second channel buffer that outputs a negative data signal. For example, the gamma buffer may comprise a first gamma voltage block that generates a positive gamma voltage and a second gamma voltage block that generates a negative gamma voltage. For example, each of the first gamma voltage block and the second gamma voltage block may comprise a plurality of gamma buffers that output a plurality of reference gamma voltages.

As an example, a plurality of first output adjustment units provided in the first channel buffer and the first gamma voltage block may each comprise a first input stage and a first output stage. One side of the first output stage may be connected to a first power line, the other side of the first output stage may be connected to a second power line, and the first input stage may be connected to a third power line. A first level voltage may be supplied to the first power line, a second level voltage may be supplied to the second power line, and a third level voltage may be supplied to the third power line. The first level voltage may be greater than the second level voltage, and the second level voltage may be greater than the third level voltage.

The first input stage may comprise an input unit and a bias circuit, and the input unit may comprise a first conductivity type transistor and a second conductivity type transistor. The first conductivity type transistor and the second conductivity type transistor may comprise NMOS transistors. The drain electrodes of the first conductivity type transistor and the second conductivity type transistor may be connected to the first output stage, and the source electrodes of the first conductivity type transistor and the second conductivity type transistor may be connected to the third power line. The first input voltage and the first output voltage may be input to the gate electrodes of the first conductivity type transistor and the second conductivity type transistor, respectively. The first input voltage or the first output voltage may be greater than the second level voltage.

Even if the lower limit or a value close to the lower limit of the first input voltage or the first output voltage is supplied to the gate electrodes of the first conductivity type transistor and the second conductivity type transistor, the difference between the lower limit or the value close to the lower limit of the first input voltage or the first output voltage and the third level voltage supplied to the source electrodes of the first conductivity type transistor and the second conductivity type transistor is large, so that the first conductivity type transistor and the second conductivity type transistor can operate stably. Accordingly, since the first conductivity type transistor and the second conductivity type transistor have constant gain characteristics or offset characteristics in the entire range of the lower limit and upper limits of the first input voltage or the first output voltage, the gain characteristics or offset characteristics can be improved.

Meanwhile, as another example, the plurality of second output adjustment units provided in the second channel buffer and the second gamma voltage block may each comprise a second input stage and a second output stage.

One side of the second output stage may be connected to the second power line, the other side of the second output stage may be connected to the third power line, and the second input stage may be connected to the first power line.

The second input stage may comprise an input unit and a bias circuit, and the input unit may comprise a third conductivity type transistor and a fourth conductivity type transistor. The third conductivity type transistor and the fourth conductivity type transistor may comprise PMOS transistors. The drain electrodes of the third conductivity type transistor and the fourth conductivity type transistor may be connected to the second output stage, and the source electrodes of the third conductivity type transistor and the fourth conductivity type transistor may be connected to the first power line. The second input voltage and the second output voltage may be input to the gate electrodes of the third conductivity type transistor and the fourth conductivity type transistor, respectively. The second input voltage or the second output voltage may be smaller than the second level voltage.

Even if the upper limit or a value close to the upper limit of the second input voltage or the second output voltage is supplied to the gate electrodes of the third conductivity type transistor and the fourth conductivity type transistor, the difference between the upper limit or a value close to the upper limit of the second input voltage or the second output voltage and the first level voltage supplied to the source electrodes of the third conductivity type transistor and the fourth conductivity type transistor is large, so that the third conductivity type transistor and the fourth conductivity type transistor can be operated stably. Accordingly, since the third conductivity type transistor and the fourth conductivity type transistor have constant gain characteristics or offset characteristics in the entire range of the lower limit and upper limit of the second input voltage or the second output voltage, the gain characteristics or offset characteristics can be improved.

Additional scope of applicability of the embodiments will become apparent from the detailed description that follows. However, since various changes and modifications within the spirit and scope of the embodiments may be clearly understood by those skilled in the art, the detailed description and specific embodiments, such as preferred embodiments, should be understood as being given by way of example only.

DETAILED DESCRIPTION OF EMBODIMENTS

Figure 1:
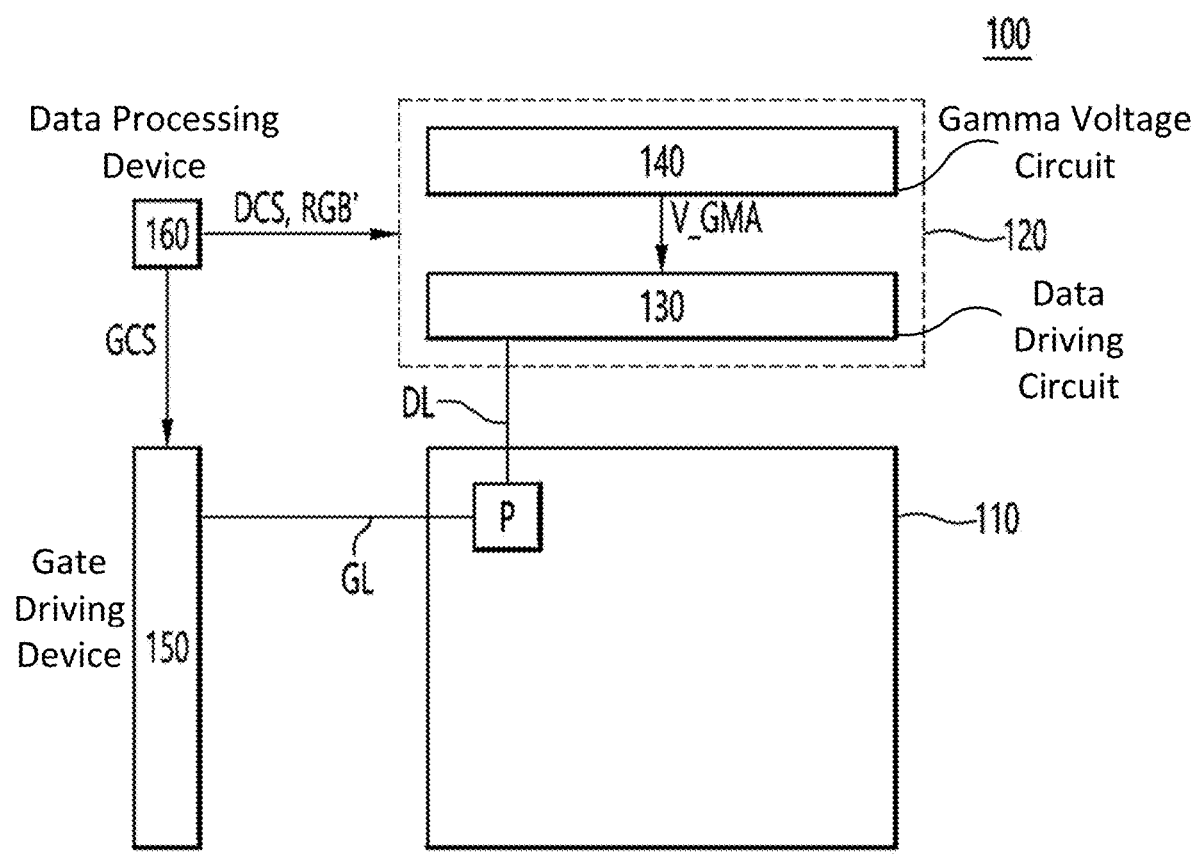
FIG. 1 is a block diagram illustrating a display device according to an embodiment.

Hereinafter, the embodiment disclosed in this specification will be described in detail with reference to the accompanying drawings, but the same or similar elements are given the same reference numerals regardless of reference numerals, and redundant descriptions thereof will be omitted. The suffixes 'module' and 'unit' for the elements used in the following descriptions are given or used interchangeably in consideration of ease of writing the specification, and do not themselves have a meaning or role that is distinct from each other. In addition, the accompanying drawings are for easy understanding of the embodiment disclosed in this specification, and the technical idea disclosed in this specification is not limited by the accompanying drawings. Also, when an element such as a layer, region or substrate is referred to as being 'on' another element, this means that there can be directly on the other element or be other intermediate elements therebetween.

Hereinafter, ' __ unit' may be used interchangeably with "circuit", "integrated circuit", "block", etc. For example, a digital-to-analog conversion unit may be used interchangeably with a digital-to-analog circuit. For example, the polarity control switching unit may be used interchangeably with the polarity control switching circuit.

Hereinafter, the positive data signal and the positive gamma voltage may be collectively referred to as positive signals, and the negative data signal and the negative gamma voltage may be collectively referred to as negative signals. The positive signal may be named the first signal, and the negative signal may be named the second signal, or vice versa.

Hereinafter, the first input voltage or the first output voltage may be a positive gamma voltage or a positive data signal, and the second input voltage or the second output voltage may be a negative gamma voltage or a negative data signal.

FIG. 1 is a block diagram illustrating a display device according to an embodiment.

Referring to FIG. 1, the display device 100 according to the embodiment may comprise a display panel 110 and a panel driving device 120, 150 and 160 that drives the display panel 110.

In the embodiment, the display panel 110 may be a liquid crystal display panel, but is not limited thereto. A plurality of data lines DL and a plurality of gate lines GL may be arranged on the display panel 110. A plurality of pixels P may be arranged at crossings of the plurality of data lines DL and the plurality of gate lines GL. The plurality of pixels P may be arranged in a matrix.

The pixel P may be a minimum unit for displaying an image. In order to display such an image, the pixel P may comprise a plurality of sub-pixels for displaying a plurality of colors. For example, the pixel P may comprise a first sub-pixel for displaying a red color, a second sub-pixel for displaying a green color, and a third sub-pixel for displaying a blue color, but is not limited thereto.

The panel driving device may comprise a gate driving device 150, a data driving device 120, a data processing device 160, etc. The panel driving device may comprise more components than these.

The gate driving device 150 can supply a scan signal having a turn-on voltage or a turn-off voltage to the gate line GL. For example, the turn-on voltage can have a high level and the turn-off voltage can have a low level, but is not limited thereto. For example, the pixel P can be connected to the data line DL in response to a scan signal of the turn-on voltage, so that an image corresponding to the data signal can be displayed. For example, the pixel P is disconnected from the data line DL in response to the scan signal of the turn-off voltage, so that an image is not displayed.

The gate driving device 150 can comprise at least one or more gate driving circuit. The gate driving circuit can comprise a gate driver integrated circuit (IC).

The data driving device 120 can comprise a data driving circuit 130, a gamma voltage circuit 140, etc. The data driving device 120 can comprise more components than these. The gamma voltage circuit 140 may not be comprised in the data driving device 120 and may be provided separately.

The data driving circuit 130 may generate a data signal and supply the data signal to the data line DL of the display panel 110. When the data line DL is connected to the pixel P in response to the scan signal supplied to the gate line GL, the data signal may be supplied to the pixel P through the data line DL.

The data driving circuit 130 may convert the digital data RGB' provided from the data processing device 160 into a data signal using the gamma voltage V_GMA provided from the gamma voltage circuit 140. Here, the data signal may be referred to as a data voltage as an analog data signal.

The gamma voltage circuit 140 may generate a plurality of gamma voltages V_GMA using a preset number of reference gamma voltages and output the generated plurality of gamma voltages V_GMA to the data driving circuit 130.

The data processing device 160 can supply various control signals GCS and DCS to the gate driving device 150 and the data driving device 120. For example, the data processing device 160 can generate a gate control signal GCS that starts scanning according to the timing implemented in each frame and transmit the generated gate control signal GCS to the gate driving device 150. The data processing device 160 can convert video data input from an external device into digital data RGB' having a data signal format used by the data driving device 120, and then output the converted digital data RGB' to the data driving device 120. The data processing device 160 can transmit a data control signal DCS that controls the data driving device 120 to supply a data signal to each pixel P according to each timing.

The data control signal DCS can comprise a source start pulse SSP, a source shift clock SSC, a source output enable (SOE) signal, etc.

When the data processing device 160 transmits digital data RGB' corresponding to one horizontal line of the display panel 110 to the data driving device 120, it can divide and transmit the digital data RGB' to fit a plurality of horizontal driving periods. A different gamma setting value can be transmitted to the data driving device 120 for each horizontal driving period.

The data processing device 160 can be called a timing controller.

Figure 2:
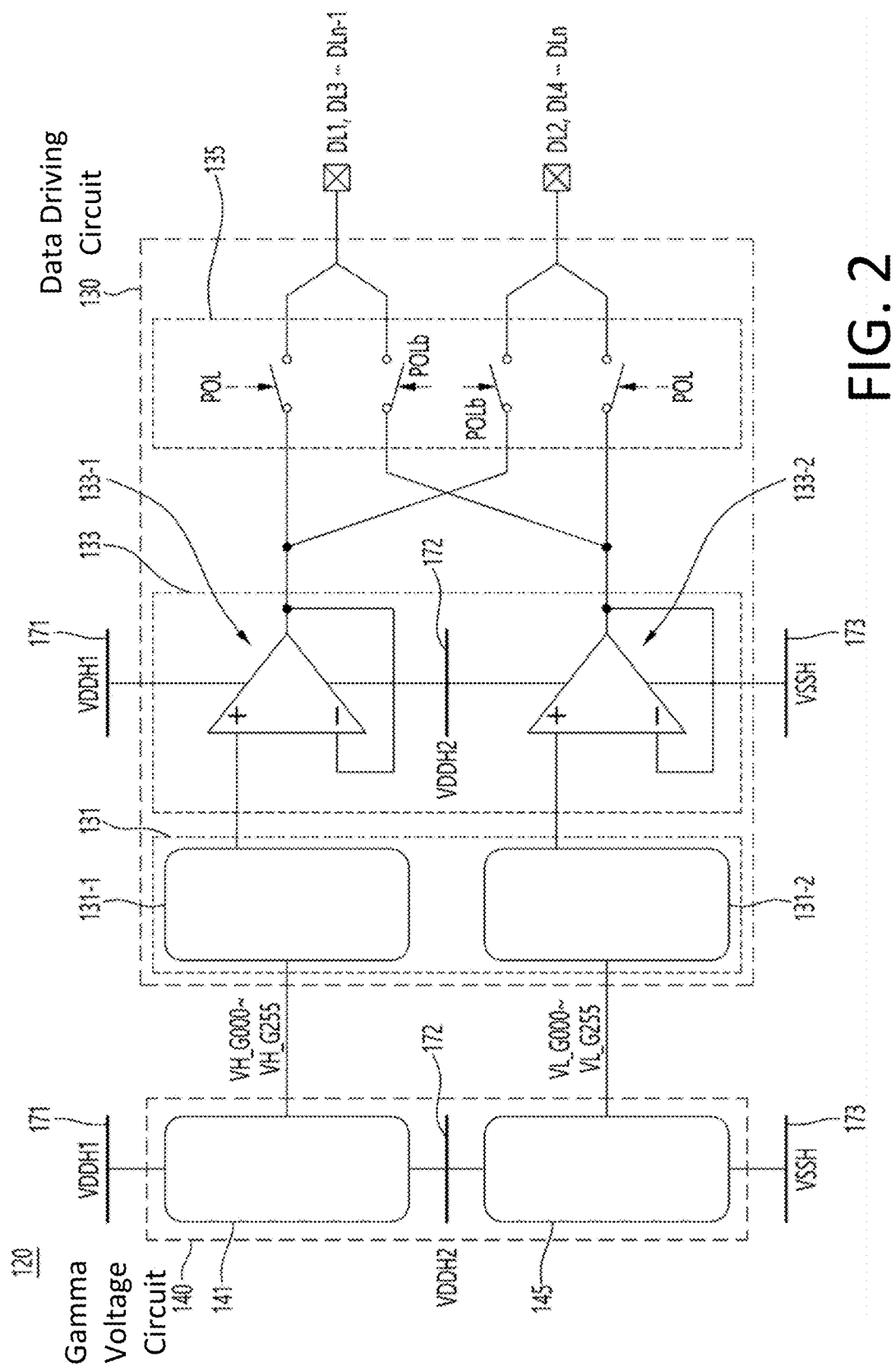
FIG. 2 is a block diagram illustrating a data driving device of FIG. 1.

FIG. 2 is a block diagram illustrating the data driving device of FIG. 1.

Referring to FIGS. 1 and 2, the data driving device 120 can comprise a gamma voltage circuit 140 and a data driving circuit 130.

The gamma voltage circuit 140 can comprise a first gamma voltage block 141 and a second gamma voltage block 145. The first gamma voltage block 141 can output a positive gamma voltage, and the second gamma voltage block 145 can output a negative gamma voltage. The positive gamma voltage can be used to generate a positive data signal. The negative gamma voltage can be used to generate a negative data signal.

As will be described later, a digital-to-analog converter 131 can output a positive data signal using the positive gamma voltage, and can output a negative data signal using the negative gamma voltage. For example, the positive data signal and the negative data signal can be supplied to adjacent data lines on the display panel 110, respectively. For example, the positive data signal and the negative data signal can be alternately supplied to adjacent data lines in a frame unit.

For example, the positive gamma voltage can comprise, for example, a positive gamma voltage corresponding to each of 0 to 255 grayscales. For example, the negative gamma voltage can comprise, for example, a negative gamma voltage corresponding to each of 0 to 255 grayscales. In the positive gamma voltage, the 0 to 255 grayscales can be determined in a voltage range between the second level voltage VDDH2 and the first level voltage VDDH1, respectively. The first level voltage VDDH1 can be greater than the second level voltage VDDH2. In the negative gamma voltage, the 0 to 255 grayscales can be determined in a voltage range between the third level voltage VSSH and the second level voltage VDDH2, respectively. The second level voltage VDDH2 can be greater than the third level voltage VSSH. This will be described in detail later. The first gamma voltage block 141 can generate a plurality of positive gamma voltages corresponding to the 0 to 255 grayscales between the first level voltage VDDH1 and the second level voltage VDDH2.

In the above, for convenience, the upper limit of the grayscale is described as 255 grayscales, but higher grayscales may also be possible.

Figure 3:
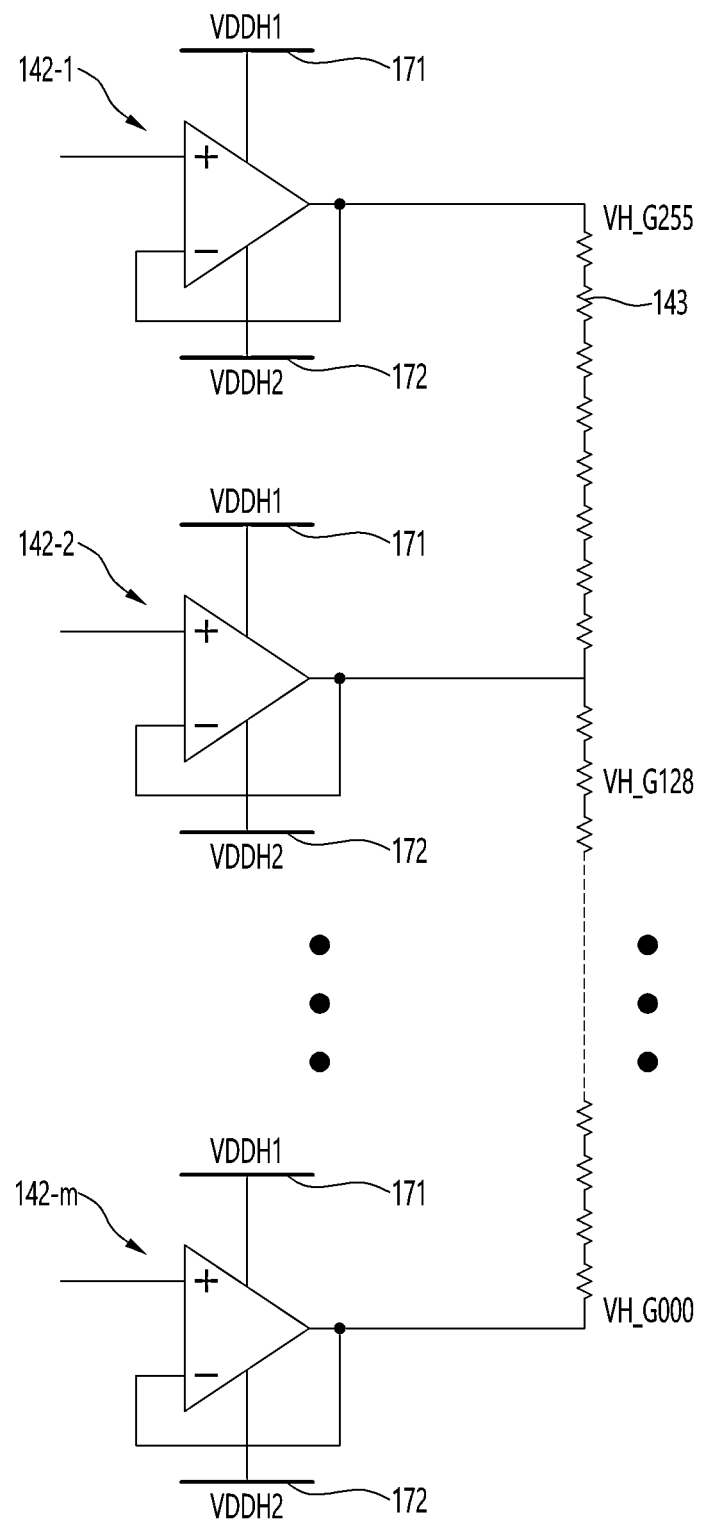
FIG. 3 illustrates a first gamma voltage block of FIG. 3.

As illustrated in FIG. 3, the first gamma voltage block 141 may comprise a plurality of first output adjustment units 142-1 to 142-$m$ that output reference gamma voltages, and a plurality of resistors 143 that are connected between the output terminals of the plurality of first output adjustment units 142-1 to 142-$m$ to generate a plurality of positive gamma voltages. The resistors 143 may be variable resistors, but are not limited thereto.

The plurality of first output adjustment units 142-1 to 142-$m$ may each output a voltage between the first level voltage VDDH1 and the second level voltage VDDH2 as the reference gamma voltage. The first level voltage VDDH1 may be greater than the second level voltage VDDH2.

In this case, the first reference gamma voltage of the first-first output adjustment unit 142-1 may be the largest, and the m-th reference gamma voltage of the (1-m)-th output adjustment unit 142-$m$ may be the smallest. The first reference gamma voltage may be smaller than the first level voltage VDDH1 supplied to the first power line 171. The m-th reference gamma voltage may be greater than the second level voltage VDDH2 supplied to the second power line 172. For example, the first reference gamma voltage of the first-first output adjustment unit 142-1 may be output as a gamma voltage corresponding to 255 grayscale. For example, the m-th reference gamma voltage of the (1-m)-th output adjustment unit 142-$m$ may be generated as a gamma voltage corresponding to 0 grayscale. Accordingly, a plurality of gamma voltages corresponding to 0 to 255 grayscales can be generated by using a plurality of first output adjustment units 142-1 to 142-$m$ and a plurality of resistors 143.

Meanwhile, referring again to FIGS. 1 and 2, the second gamma voltage block 145 can generate a plurality of negative gamma voltages corresponding to 0 to 255 grayscales between the second level voltage VDDH2 and the third level voltage VSSH.

Figure 4:
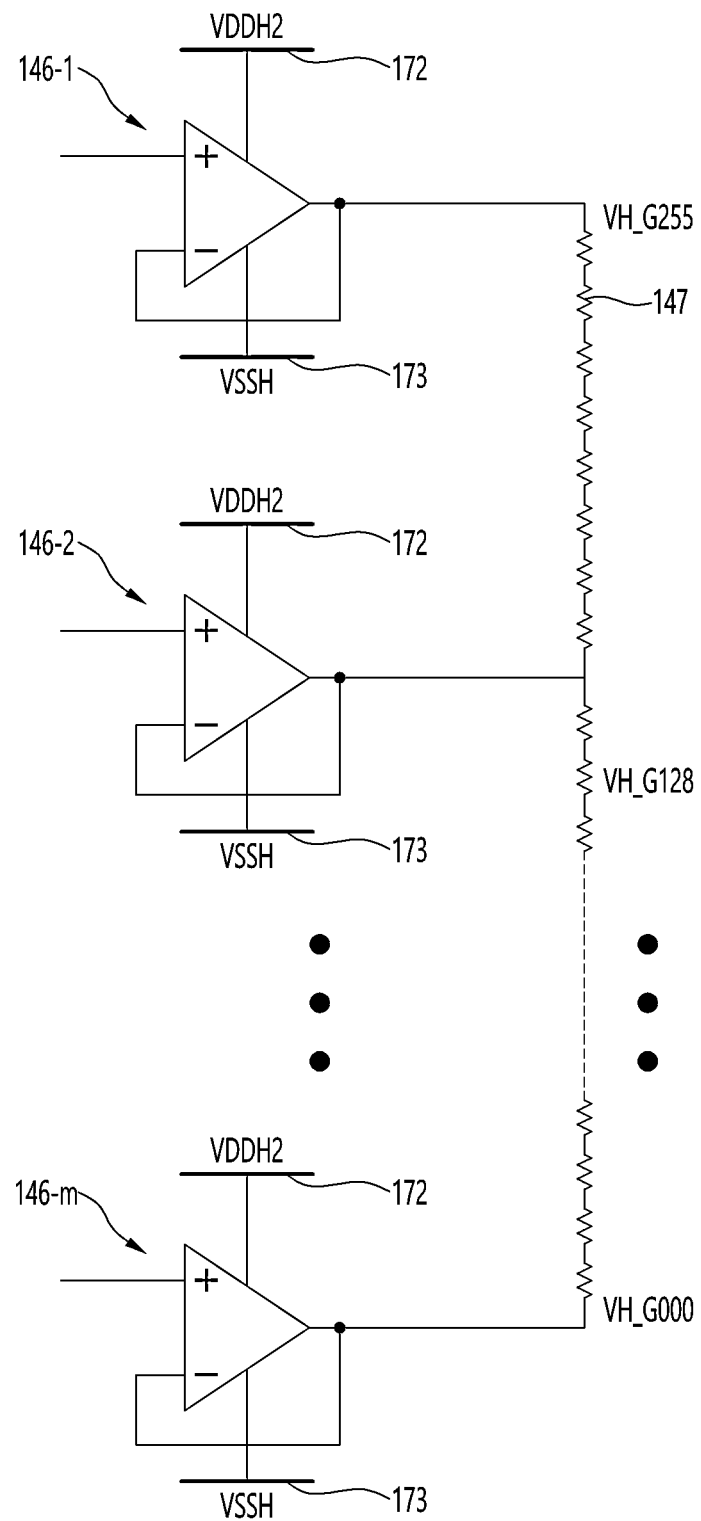
FIG. 4 illustrates a second gamma voltage block of FIG. 3.

As illustrated in FIG. 4, the second gamma voltage block 145 can comprise a plurality of second output adjustment units 146-1 to 146-$m$ that output reference gamma voltages, and a plurality of resistors 147 that generate a plurality of negative gamma voltages, which are connected between the output terminals of the plurality of second output adjustment units 146-1 to 146-$m$. The resistors 147 may be variable resistors, but are not limited thereto.

Each of the second output adjustment units 146-1 to 146-m may output a voltage between the second level voltage VDDH2 and the third level voltage VSSH as a reference gamma voltage. The second level voltage VDDH2 may be greater than the third level voltage VSSH.

In this case, the first reference gamma voltage of the second-first output adjustment unit 146-1 may be the largest, and the m-th reference gamma voltage of the (2-m)-th output adjustment unit 146-m may be the smallest. The first reference gamma voltage may be smaller than the second level voltage VDDH2 supplied to the second power line 172. The m-th reference gamma voltage may be greater than the third level voltage VSSH supplied to the third power line 173.

For example, the first reference gamma voltage of the second-first output adjustment unit 146-1 may be output as a gamma voltage corresponding to 255 grayscale. For example, the m-th reference gamma voltage of the (2-m)-th output adjustment unit 146-m may be output as a gamma voltage corresponding to 0 grayscale. Alternatively, the first reference gamma voltage of the second-first output adjustment unit 146-1 may be output as a gamma voltage corresponding to 0 grayscale, and the m-th reference gamma voltage of the (2-m)-th output adjustment unit 146-m may be output as a gamma voltage corresponding to 255 grayscale. Accordingly, a plurality of gamma voltages corresponding to 0 grayscale to 255 grayscales may be generated by using a plurality of second output adjustment units 146-1 to 146-m and a plurality of resistors 147.

Meanwhile, referring back to FIG. 1 and FIG. 2, the data drive circuit 130 may comprise a digital-to-analog conversion unit (131, hereinafter referred to as a DAC conversion unit), a buffer 133, and a polarity control switching unit 135.

The DAC conversion unit 131 may comprise a first DAC conversion unit 131-1 and a second DAC conversion unit 131-2. The buffer 133 may comprise a first output adjustment unit 133-1 and a second output adjustment unit 133-2.

The output terminal of the first DAC conversion unit 131-1 may be connected to the input terminal of the first output adjustment unit 133-1. For example, the output terminal of the first DAC conversion unit 131-1 may be connected to the non-inverting (+) terminal of the first output adjustment unit 133-1. The output voltage output through the output terminal of the first DAC conversion unit 131-1, i.e., the positive data signal, can be input to the non-inverting (+) terminal of the first output adjustment unit 133-1.

The output terminal of the second DAC conversion unit 131-2 can be connected to the input terminal of the second output adjustment unit 133-2. For example, the output terminal of the second DAC conversion unit 131-2 can be connected to the non-inverting (+) terminal of the second output adjustment unit 133-2. The output voltage output through the output terminal of the second DAC conversion unit 131-2, i.e., the negative data signal, can be input to the non-inverting (+) terminal of the second output adjustment unit 133-2.

The first DAC conversion unit 131-1 can convert digital data RGB' provided from the data processing device 160 into an analog data signal. The first DAC conversion unit 131-1 can select one of a plurality of positive gamma voltages corresponding to 0 to 255 grayscales output from the first gamma voltage block 141 based on the digital data RGB' and output the selected positive gamma voltage as a positive data signal. Accordingly, an image of 0 to 255 grayscales can be displayed by the positive data signal.

The first output adjustment unit 133-1 can minimize the difference between the positive data signal input to the non-inverting (+) terminal and the output voltage fed back from the output terminal. Accordingly, the positive data signal can be output as an output voltage.

Meanwhile, the second DAC conversion unit 131-2 can convert the digital data RGB' provided from the data processing device 160 into an analog data signal. The second DAC conversion unit 131-2 can select one of a plurality of negative gamma voltages corresponding to 0 to 255 grayscales output from the second gamma voltage block 145 based on the digital data RGB' and output the selected negative gamma voltage as a negative data signal. Accordingly, an image of 0 to 255 grayscales can be displayed by the negative data signal.

The second output adjustment unit 133-2 can minimize the difference between the negative data signal input to the non-inverting (+) terminal and the output voltage fed back from the output terminal. Accordingly, the negative data signal can be output as an output voltage.

Meanwhile, the polarity control switching unit 135 can alternately supply the output voltage of the first output adjustment unit 133-1 and the output voltage of the second output adjustment unit 133-2 to adjacent data lines. To this end, the polarity control switching unit 135 can comprise a plurality of switches that are switched by the polarity signal POL and the polarity inversion signal POLb, respectively. For example, during a first frame, the output voltage of the first output adjustment unit 133-1 can be supplied to the first data line DL1, and the output voltage of the second output adjustment unit 133-2 can be supplied to the second data line DL2. Between the first frame and a second frame, the output paths of the output voltage of the first output adjustment unit 133-1 and the output voltage of the second output adjustment unit 133-2 can be changed by a switching control of the polarity control switching unit 135. Accordingly, during the second frame, the output voltage of the first output adjustment unit 133-1 can be supplied to the second data line DL2, and the output voltage of the second output adjustment unit 133-2 can be supplied to the first data line DL1.

Various buffers 200, 240, 300 and 340 according to the embodiment will be described with reference to FIGS. 5 to 17.

The buffer (200 of FIG. 5) according to the first embodiment and/or the buffer (300 of FIG. 12) according to the third embodiment below may be one of the plurality of first output adjustment units 142-1 to 142-m of the first gamma voltage block 141 illustrated in FIG. 2 or may be the first output adjustment unit 133-1. The buffer (240 of FIG. 9) according to the second embodiment and/or the buffer (340 of FIG. 15) according to the fourth embodiment below may be one of the plurality of second output adjustment units 146-1 to 146-m of the second gamma voltage block 145 illustrated in FIG. 2 or may be the second output adjustment unit 133-2.

In each transistor below, the gate electrode may be referred to as the first electrode, the drain electrode may be referred to as the second electrode, and the source electrode may be referred to as the third electrode.

Figure 5:
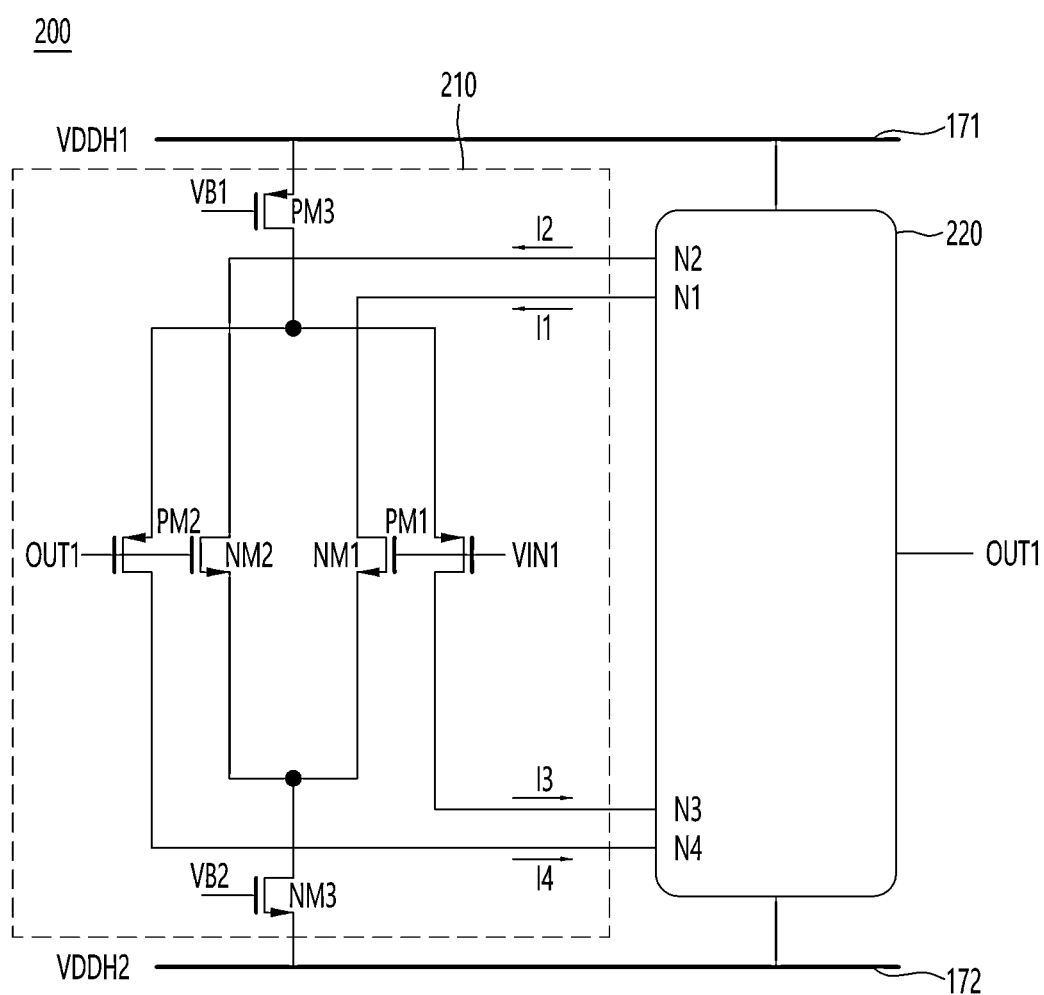
FIG. 5 illustrates a buffer according to the first embodiment.

Hereinafter, a positive signal may mean a positive data signal or a positive gamma voltage, and a negative signal may mean a negative data signal or a negative gamma voltage. FIG. 5 illustrates a buffer according to the first embodiment.

Referring to FIG. 5, a buffer 200 according to the first embodiment may comprise a first input stage 210 and a first output stage 220.

The first input stage 210 may monitor a difference between a first input voltage VIN1 and a first output voltage OUT1 and adjust control currents I1 to I4 according to the difference. By adjusting the control currents I1 to I4, the control voltages (HIP, HIN of FIG. 6) of the first output stage 220 may be adjusted, thereby performing different pull-up or pull-down operations according to the grayscale. For example, when a first output voltage OUT1 of a high-gray is output, the control currents I1 to I4 can be adjusted so that the control voltage HIP for controlling the pull-up operation is quickly lowered and the control voltage HIN for controlling the pull-down operation is quickly increased. For example, when a first output voltage OUT1 of a low-gray is output, the control currents I1 to I4 can be adjusted so that the control voltage HIP for controlling the pull-up operation is gradually lowered and the control voltage HIN for controlling the pull-down operation is gradually lowered.

The first input stage 210 may comprise a first input unit composed of second conductivity type transistors PM1 and PM2, a second input unit composed of first conductivity type transistors NM1 and NM2, a first bias circuit, a second bias circuit, etc. The first bias circuit may comprise a second conductivity type transistor PM3, and the second bias circuit may comprise a first conductivity type transistor NM3.

The second conductivity type transistors PM1 and PM2 of the first input unit may be controlled by the first input voltage VIN1 and the first output voltage OUT1, respectively. The source electrode of each of the second conductivity type transistors PM1 and PM2 may be connected to the first power line 171, and the drain electrodes of the second conductivity type transistors PM1 and PM2 may be connected to the third and fourth nodes N3 and N4 of the first output stage 220, respectively.

The second conductivity type transistors PM1 and PM2 of the first input unit may be controlled according to the first input voltage VIN1 and the first output voltage OUT1, so that the source currents I3 and I4 provided by the first input stage 210 may be adjusted.

The first conductivity type transistors NM1 and NM2 of the second input unit can be controlled by the first input voltage VIN1 and the first output voltage OUT1, respectively. The source electrodes of the first conductivity type transistors NM1 and NM2 can be connected to the second power line 172, and the drain electrodes of the first conductivity type transistors NM1 and NM2 can each be connected to the first and second nodes N1 and N2 of the first output stage 220.

The first conductivity type transistors NM1 and NM2 of the second input unit can be controlled according to the first input voltage VIN1 and the first output voltage OUT1, so that the sink currents I1 and I2 provided by the first output stage 220 can be adjusted.

The source currents I3 and I4 and the sink currents I1 and I2 can be called control currents.

The second conductivity type transistor PM3 of the first bias circuit may be connected between the first power line 171 and the first input unit. The second conductivity type transistor PM3 of the first bias circuit may be controlled by the first bias voltage VB1 to provide a bias current to the second conductivity type transistors PM1 and PM2 of the first input unit. The source currents I3 and I4 may be adjusted by the bias current.

The first conductivity type transistor NM3 of the second bias circuit may be connected between the second input unit and the second power line 172. The first conductivity type transistor NM3 of the second bias circuit may be controlled by the second bias voltage VB2 to provide a bias current to the first conductivity type transistors NM1 and NM2 of the second input unit. The sink currents I1 and I2 may be adjusted by the bias current.

Meanwhile, the first output stage 220 can output the first output voltage OUT1 as a positive signal by performing a pull-up or pull-down operation according to the control voltages HIP and HIN.

Figure 6:
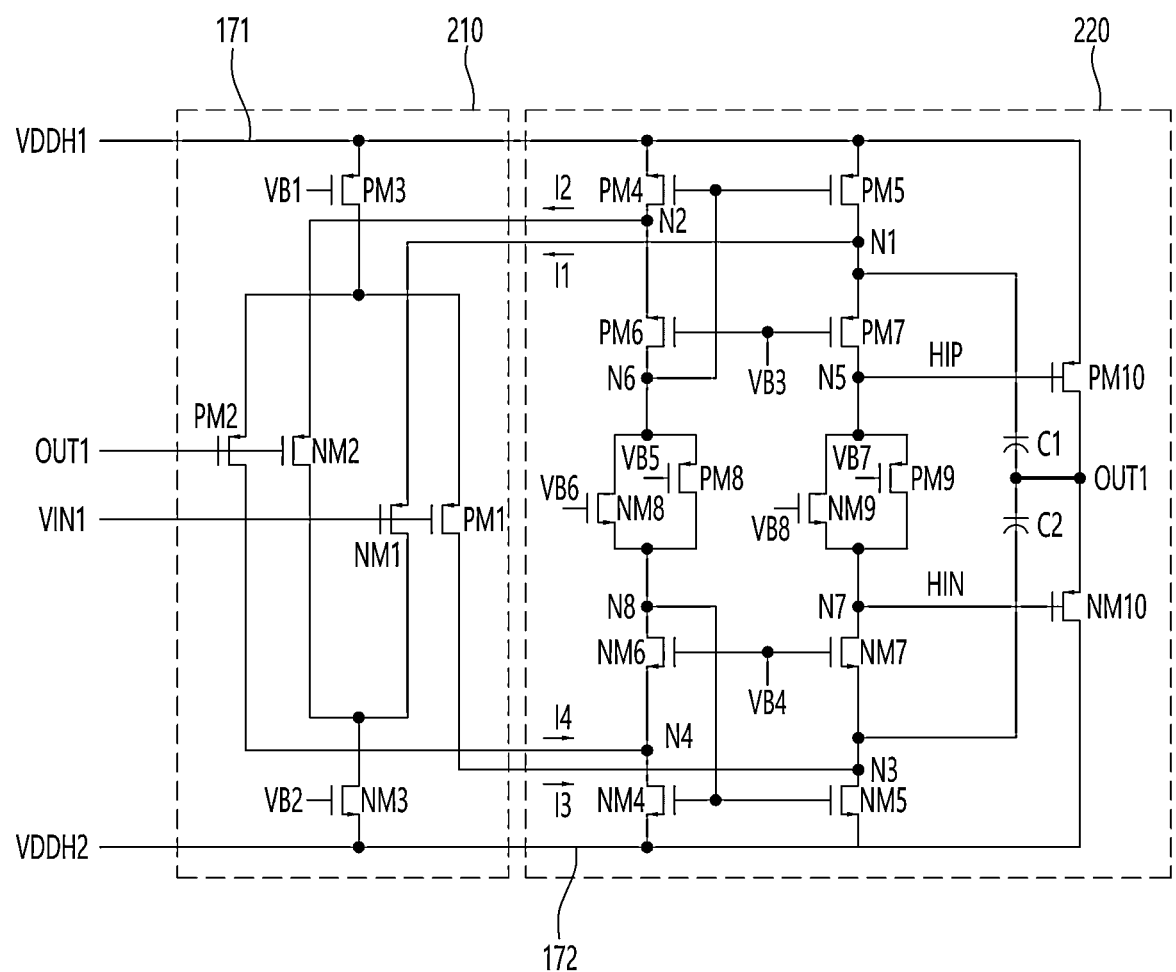
FIG. 6 is a circuit diagram illustrating a first output stage of FIG. 5.

Referring to FIG. 6, the first output stage 220 will be described in detail. FIG. 6 is only one example of the first output stage 220, and various modified examples are possible.

Referring to FIG. 6, the first output stage 220 can comprise a first current mirror, a first cascode circuit, a second current mirror, a second cascode circuit, a third bias circuit, a fourth bias circuit, a pull-up transistor, a pull-down transistor, a capacitor unit C1 and C2, etc. The first current mirror, the first cascode circuit, the second current mirror, the second cascode circuit, the third bias circuit, and the fourth bias circuit may not be comprised in the first output stage 220 and may be configured as a separate current control stage.

The pull-up transistor may be called a first control transistor, and the pull-down transistor may be called a second control transistor. For example, the pull-up transistor may comprise a second conductivity type transistor PM10, and the pull-down transistor may comprise a first conductivity type transistor NM10.

The first current mirror may comprise PMOS transistors PM4 and PM5. The first cascode circuit may comprise PMOS transistors PM6 and PM7. The second current mirror may comprise NMOS transistors NM4 and NM5. The second cascode circuit may comprise NMOS transistors NM6 and NM7. The third bias circuit may comprise a PMOS transistor PM8 and an NMOS transistor NM8. The fourth bias circuit may comprise a PMOS transistor PM9 and an NMOS transistor NM9. The third bias circuit and the fourth bias circuit may each be defined as a floating bias circuit.

The PMOS transistors PM4 and PM5 of the first current mirror may be connected to the NMOS transistors NM1 and NM2 of the second input unit of the first input stage 210 and may be connected in the form of a current mirror between the first power line 171 and the first cascode circuit. The gate electrodes of the PMOS transistors PM4 and PM5 of the first current mirror may be connected to the output node of the first cascode circuit, i.e., the sixth node N6. The PMOS transistors PM4 and PM5 of the first current mirror can provide the sink currents I1 and I2 to the NMOS transistors NM1 and NM2 of the first input unit through the first and second nodes N1 and N2. The drain electrodes of the NMOS transistors NM1 and NM2 of the first input unit can each be connected to the first and second nodes N1 and N2. The PMOS transistors PM4 and PM5 of the first current mirror can provide an output current to the fifth and sixth nodes N5 and N6 through the first cascode circuit. The PMOS transistors PM4 and PM5 of the first current mirror can provide an output current to the first capacitor C1 through the first node N1.

The PMOS transistor PM6 of the first cascode circuit can be connected between the PMOS transistor PM4 of the first current mirror and the PMOS transistor PM8 and the NMOS transistor NM8 of the third bias circuit. The PMOS transistor PM7 of the first cascode circuit can be connected between the PMOS transistor PM5 of the first current mirror and the PMOS transistor PM9 and the NMOS transistor NM9 of the fourth bias circuit. The PMOS transistors PM6 and PM7 of the first cascode circuit can be controlled by the third bias voltage VB3, so that the first control voltage HIP can be provided to the pull-up transistor PM10 through the fifth node N5.

The fourth and fifth NMOS transistors NM4 and NM5 of the second current mirror are connected to the first input PMOS transistors PM1 and PM2 of the first input stage 210 and can be connected in the form of a current mirror between the second cascode circuit and the second power line 172.

The gate electrodes of the NMOS transistors NM4 and NM5 of the second current mirror can be connected to the output node of the second cascode circuit, i.e., the eighth node N8. The NMOS transistors NM4 and NM5 of the second current mirror can provide the source currents I3 and I4 provided from the first input stage 210 to the third and fourth nodes N3 and N4. The NMOS transistors NM4 and NM5 of the second current mirror can provide output current to the seventh and eighth nodes N7 and N8 through the second cascode circuit. The NMOS transistors NM4 and NM5 of the second current mirror can provide output current to the second capacitor C2 through the third node N3.

The NMOS transistors NM6 of the second cascode circuit can be connected between the PMOS transistor PM8 and the NMOS transistor NM8 of the third bias circuit and the NMOS transistor NM4 of the second current mirror. The NMOS transistors NM7 of the second cascode circuit can be connected between the PMOS transistor PM9 and the NMOS transistor NM9 of the fourth bias circuit and the NMOS transistor NM5 of the second current mirror NM5. The NMOS transistors NM6 and NM7 of the second cascode circuit can be controlled by the fourth bias voltage VB4, so that the second control voltage HIN can be provided to the pull-down transistor NM10 through the output node N8.

The PMOS transistor PM8 and the NMOS transistor NM8 of the third bias circuit can be connected between the PMOS transistor PM6 of the first cascode circuit and the NMOS transistor NM6 of the second cascode circuit. The PMOS transistor PM8 and the NMOS transistor NM8 of the third bias circuit can be controlled by the fifth and sixth bias voltages VB5 and VB6, respectively, to provide a bias current flowing from the output node of the first cascode circuit, that is, the sixth node N6, to the output node of the second cascode circuit, that is, the eighth node N8.

The PMOS transistor PM9 and the NMOS transistor NM9 of the fourth bias circuit can be connected between the PMOS transistor PM7 of the first cascode circuit and the NMOS transistor NM7 of the second cascode circuit. The PMOS transistor PM9 and the NMOS transistor NM9 of the fourth bias circuit can be controlled by the seventh and eighth bias voltages VB7 and VB8, respectively, to provide a bias current flowing from the output node of the first cascode circuit, i.e., the fifth node N5, to the output node of the second cascode circuit, i.e., the seventh node N7.

The pull-up transistor PM10 may be controlled by the first control voltage HIP provided from the fifth node N5, and can be connected between the first power line 171 and the output terminal. The pull-up transistor PM10 can perform a pull-up operation under the control of the first control voltage HIP to increase the first output voltage OUT1. For example, when the first input voltage VIN1 rises and becomes greater than the first output voltage OUT1, the first control voltage HIP may decrease and be supplied to the pull-up transistor PM10 as a gate-on voltage (or turn-on voltage). Accordingly, the pull-up transistor PM10 may perform a pull-up operation to increase the first output voltage OUT1.

The pull-down transistor NM10 may be controlled by the second control voltage HIN provided from the seventh node N7 and may be connected between the output terminal and the second power line 172. The pull-down transistor NM10 may perform a pull-down operation under the control of the second control voltage HIN to decrease the first output voltage OUT1. For example, when the first input voltage VIN1 decreases and becomes smaller than the first output voltage OUT1, the second control voltage HIN may increase and be supplied to the pull-down transistor NM10 as a gate-on voltage. Accordingly, the pull-down transistor NM10 may perform a pull-down operation to decrease the first output voltage OUT1.

The capacitor unit may comprise a first capacitor C1 connected between the first node N1 and the output terminal, and a second capacitor C2 connected between the third node N3 and the output terminal. The capacitor unit C1 and C2 may stabilize the first output voltage OUT1, so that the first output voltage OUT1 does not oscillate when the first output voltage OUT1 increases or decreases.

The output current may be provided to the first capacitor C1 through the first node N1 connected to the first current mirror PM4 and PM5. The output current can be provided to the second capacitor C2 through the third node N3 connected to the second current mirror NM4 and NM5.

Referring again to FIG. 5, one side of the first input stage 210 and one side of the first output stage 220 can be commonly connected to the first power line 171, and the other side of the first input stage 210 and the other side of the first output stage 220 can be connected to the second power line 172. The first level voltage VDDH1 can be supplied to the first power line 171, and the second level voltage VDDH2 can be supplied to the second power line 172. The first input voltage VIN1 or the first output voltage OUT1 can be smaller than the first level voltage VDDH1 and greater than the second level voltage VDDH2. That is, the first input voltage VIN1 or the first output voltage OUT1 can be changed within a voltage range between the first level voltage VDDH1 and the second level voltage VDDH2.

For example, the lower limit of the first input voltage VIN1 or the first output voltage OUT1 may be similar to the second level voltage VDDH2, and the upper limit of the first input voltage VIN1 or the first output voltage OUT1 may be similar to the first level voltage VDDH1. In other words, the difference between the lower limit of the first input voltage VIN1 or the first output voltage OUT1 and the second level voltage VDDH2 may be not large, and the difference between the upper limit of the first input voltage VIN1 or the first output voltage OUT1 and the first level voltage VDDH1 may be not large.

In this case, when the lower limit or a value close to the lower limit of the first input voltage VIN1 in the first input stage 210 or the first output voltage OUT1 is supplied to the gate electrodes of the first conductivity type transistors NM1 and NM2, the difference between the first input voltage VIN1 or the first output voltage OUT1 and the second level voltage VDDH2 supplied to the source electrodes of the first conductivity type transistors NM1 and NM2 is small, so the first conductivity type transistors NM1 and NM2 may not operate. In addition, when a value close to the upper limit or the upper limit of the first input voltage VIN1 in the first input stage 210 or the first output voltage OUT1 is supplied to the gate electrodes of the second conductivity type transistors PM1 and PM2, the difference between the first input voltage VIN1 or the first output voltage OUT1 and the first level voltage VDDH1 supplied to the source electrodes of the second conductivity type transistors PM1 and PM2 is small, so that the second conductivity type transistors PM1 and PM2 may not operate.

Figure 7:
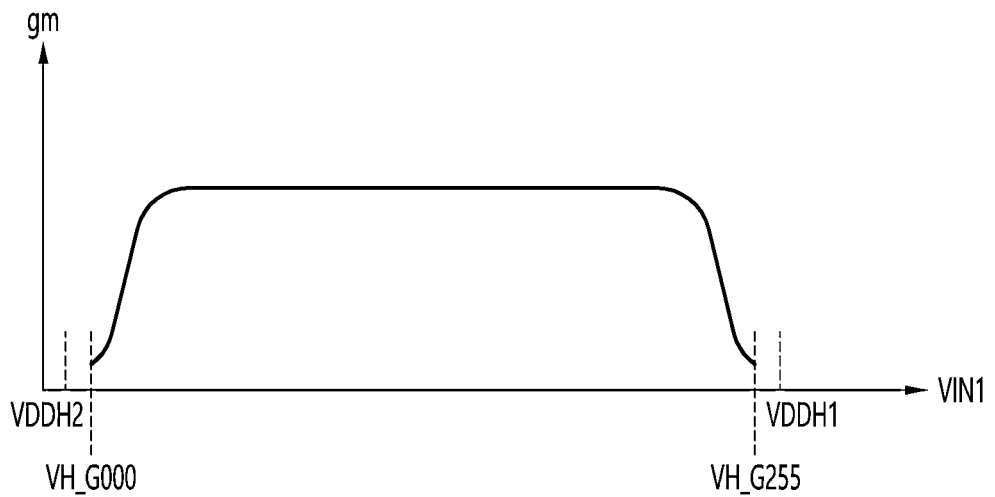
FIG. 7 illustrates gain characteristics according to a first input voltage in a buffer according to the first embodiment.
Figure 8:
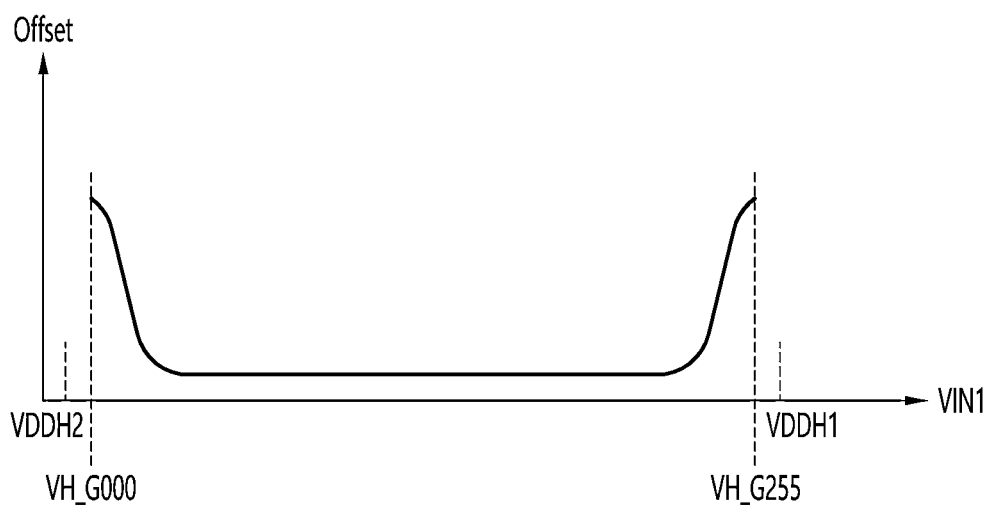
FIG. 8 illustrates offset characteristics according to a first input voltage in a buffer according to the first embodiment.

Accordingly, the gain characteristic (FIG. 7) may be degraded, and the offset characteristic (FIG. 8) may be degraded. As illustrated in FIG. 7, when the lower limit or a value close to the lower limit or the upper limit or a value close to the upper limit of the first input voltage VIN1 is supplied, it can be seen that the gain value is significantly lowered. As shown in FIG. 8, when the lower limit or a value close to the lower limit or the upper limit or a value close to the upper limit of the first input voltage VIN1 is supplied, it can be seen that the offset value is considerably large. In this way, when the gain characteristic or the offset characteristic is degraded, the desired first output voltage OUT1 may be not output, and thus poor image quality may occur when implementing an image.

Figure 9:
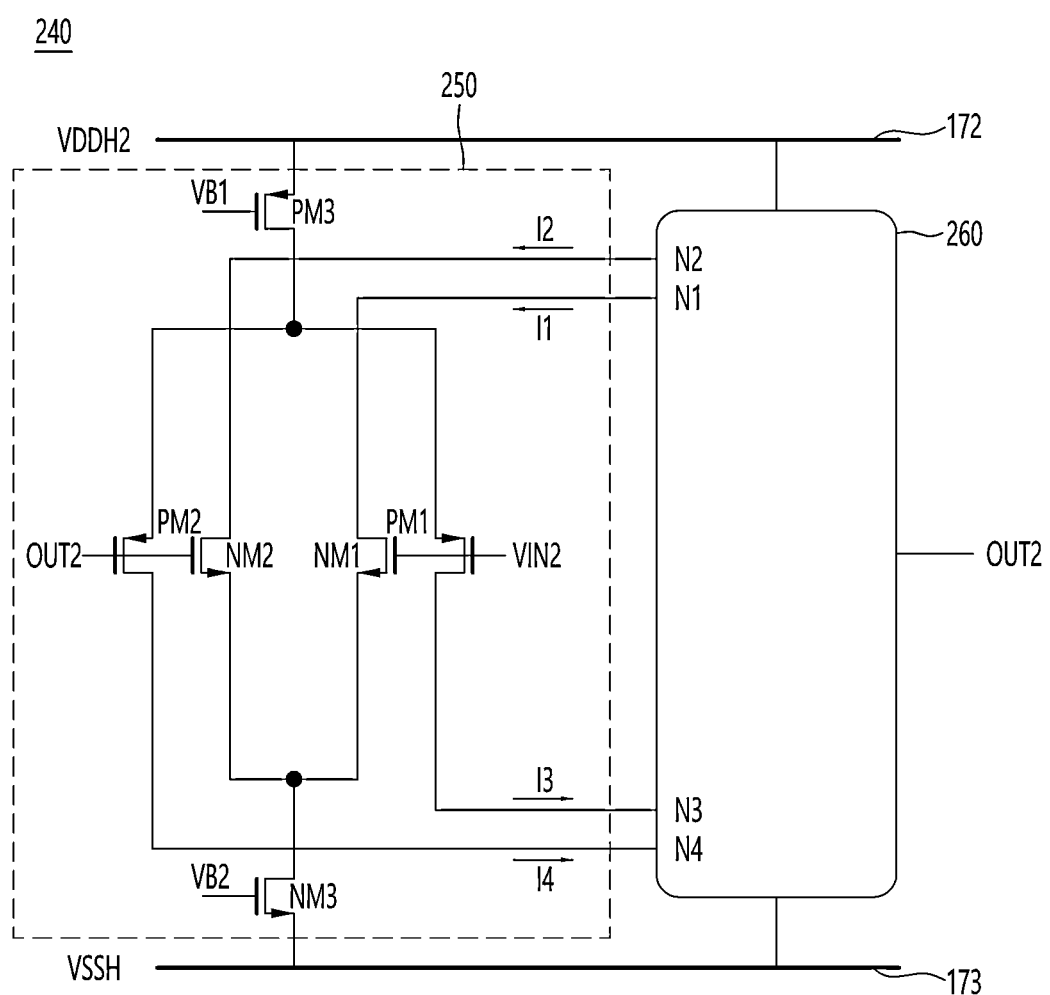
FIG. 9 illustrates a buffer according to the second embodiment.

FIG. 9 illustrates a buffer according to the second embodiment.

The buffer according to the second embodiment may be a second output adjustment unit that outputs a negative gamma voltage or a second output adjustment unit that outputs a negative data signal. In the first embodiment (FIG. 5), a positive signal may be generated using the first input voltage VIN1, the first output voltage OUT1, the first level voltage VDDH1 supplied to the first power line 171, and the second level voltage VDDH2 supplied to the second power line 172. In contrast, in the second embodiment (FIG. 9), a negative signal can be generated using the second input voltage VIN2, the second output voltage OUT2, the second level voltage VDDH2 supplied to the second power line 172, and the third level voltage VSSH supplied to the third power line 173. In the second embodiment, the same drawing symbols are given to components having the same functions as in the first embodiment (FIG. 5), and detailed descriptions are omitted.

Referring to FIG. 9, the buffer 240 according to the second embodiment may comprise a second input stage 250 and a second output stage 260.

The circuits comprised in the second input stage 250 and the circuits comprised in the second output stage 260 are the same or similar to those in the first embodiment (FIG. 5), and therefore, detailed descriptions are omitted.

One side of the second input stage 250 and one side of the second output stage 260 may be commonly connected to the second power line 172, and the other side of the second input stage 250 and the other side of the second output stage 260 may be commonly connected to the third power line 173. The second level voltage VDDH2 may be supplied to the second power line 172, and the third level voltage VSSH may be supplied to the third power line 173.

The second input voltage VIN2 or the second output voltage OUT2 may be smaller than the second level voltage VDDH2 and greater than the third level voltage VSSH.

For example, the lower limit of the second input voltage VIN2 or the second output voltage OUT2 may be similar to the third level voltage VSSH, and the upper limit of the second input voltage VIN2 or the second output voltage OUT2 may be similar to the second level voltage VDDH2. In other words, the difference between the lower limit of the second input voltage VIN2 or the second output voltage OUT2 and the third level voltage VSSH may be not large, and the difference between the upper limit of the second input voltage VIN2 or the second output voltage OUT2 and the second level voltage VDDH2 may be not large.

In this case, when the lower limit or a value close to the lower limit of the second input voltage VIN2 or the second output voltage OUT2 is supplied to the gate electrodes of the first conductivity type transistors NM1 and NM2 in the second input stage 250, the difference between the second input voltage VIN2 or the second output voltage OUT2 and the third level voltage VSSH supplied to the source electrodes of the first conductivity type transistors NM1 and NM2 is small, so the first conductivity type transistors NM1 and NM2 may not operate. In addition, when the upper limit or a value close to the upper limit of the second input voltage VIN2 or the second output voltage OUT2 in the second input stage 250 is supplied to the gate electrodes of the second conductivity type transistors PM1 and PM2, the difference between the second input voltage VIN2 or the second output voltage OUT2 and the second level voltage VDDH2 supplied to the source electrodes of the second conductivity type transistors PM1 and PM2 is small, so the second conductivity type transistors PM1 and PM2 may not operate.

Figure 10:
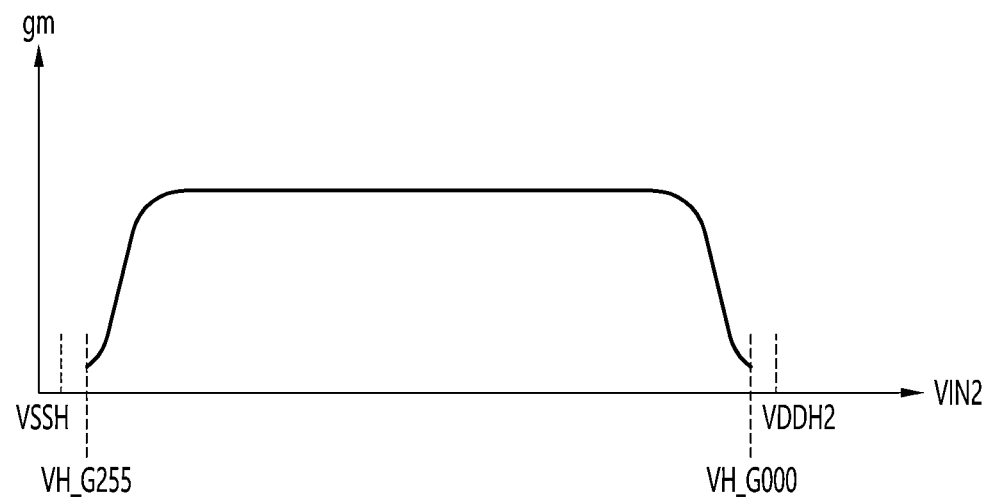
FIG. 10 illustrates gain characteristics according to the second input voltage in a buffer according to the second embodiment.
Figure 11:
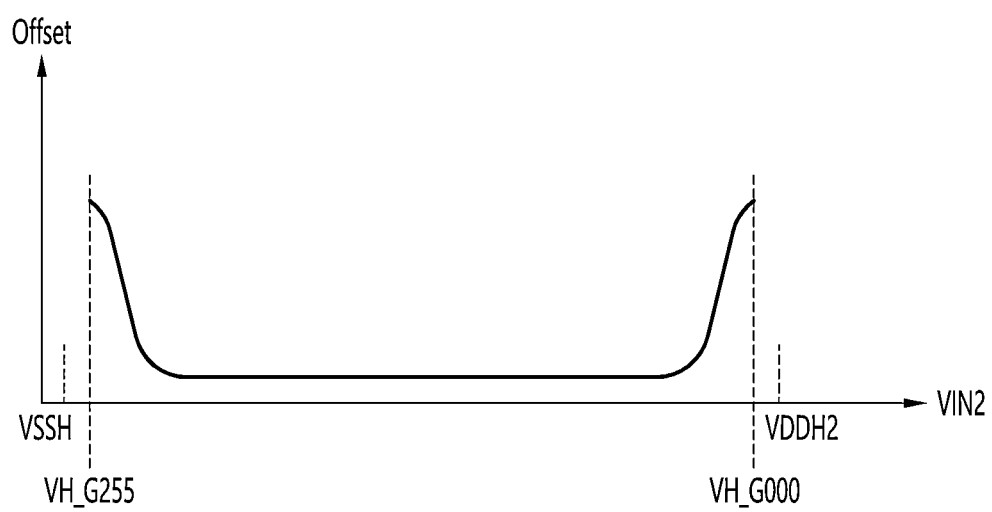
FIG. 11 illustrates offset characteristics according to the second input voltage in a buffer according to the second embodiment.

Accordingly, the gain characteristic (FIG. 10) may deteriorate, and the offset characteristic (FIG. 11) may deteriorate. As shown in FIG. 10, when the lower limit or a value close to the lower limit or the upper limit or a value close to the upper limit of the second input voltage VIN2 is supplied, it can be seen that the gain value is be significantly lowered. As shown in FIG. 11, when the lower limit or a value close to the lower limit or the upper limit or a value close to the upper limit of the second input voltage VIN2 is supplied, it can be seen that the offset value is considerably large. In this way, when the gain characteristics or offset characteristics are degraded, the desired second output voltage OUT2 may be not output, and thus poor image quality may occur when implementing an image.

As a solution to the above-described problem, the third embodiment (FIG. 12) and the fourth embodiment (FIG. 15) were proposed.

Figure 12:
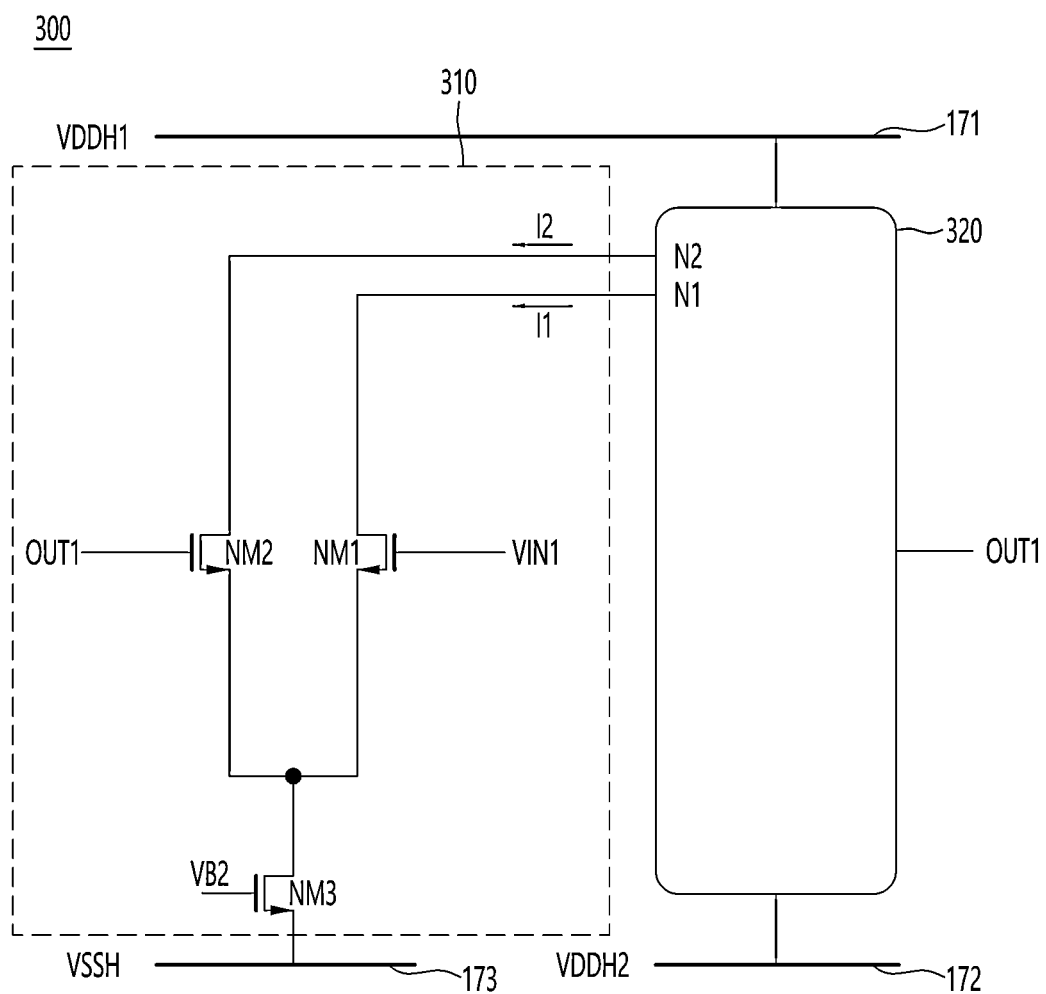
FIG. 12 illustrates a buffer according to the third embodiment.

FIG. 12 illustrates a buffer according to the third embodiment.

The third embodiment may be the same as the first embodiment (FIG. 5) except for the first input stage 310. In the third embodiment, the same drawing reference numerals are given to components having the same functions as in the first embodiment (FIG. 5), and detailed descriptions are omitted.

Referring to FIG. 12, the buffer 300 according to the third embodiment may comprise a first input stage 310 and a first output stage 320.

The circuits comprised in the first output stage 320 are the same as in the first embodiment (FIG. 5), and therefore detailed descriptions are omitted.

The first input stage 310 may comprise an input unit, a bias circuit, etc. The input unit may comprise a first conductivity type transistor NM1 and a second conductivity type transistor NM2. The bias circuit may comprise a conductivity type transistor NM3. The conductivity type transistors NM1 to NM3 may comprise NMOS transistors.

The first conductivity type transistor NM1 can be controlled by the first input voltage VIN1, and the second conductivity type transistor NM2 can be controlled by the first output voltage OUT1, respectively. The drain electrode of the first conductivity type transistor NM1 can be connected to the first node N1 of the first output stage 320, and the source electrode of the first conductivity type transistor NM1 can be connected to the third power line 173. The drain electrode of the second conductivity type transistor NM2 can be connected to the second node N2 of the first output stage 320, and the source electrode of the second conductivity type transistor NM2 can be connected to the third power line 173.

The first conductivity type transistor NM1 may be controlled according to the first input voltage VIN1, so that the first sink current I1 provided by the first output stage 320 can be adjusted. The second conductivity type transistor NM2 may be controlled according to the first output voltage OUT1, so that the second sink current I2 provided by the first output stage 320 can be adjusted. The sink currents I1 and I2 can be provided from the first and second nodes N1 and N2 of the first output stage 320 to the first input stage 310.

The conductivity type transistor NM3 of the bias circuit can be connected between the input unit NM1 and NM2 and the third power line 173. The conductivity type transistor NM3 of the bias circuit can be controlled by the second bias voltage VB2, so that a bias current can be provided to the first conductivity type transistor NM1 and the second conductivity type transistor NM2. The sink currents I1 and I2 can be adjusted by the bias current.

Meanwhile, one side of the first output stage 320 may be connected to the first power line 171, and the other side of the first output stage 320 may be connected to the second power line 172.

Unlike the first embodiment (FIG. 5), one side of the first input stage 310 may be connected to the third power line 173. Each of the first conductivity type transistors NM1 and NM2 of the input unit may be connected to the third power line 173.

For example, the drain electrode of the first NMOS transistor NM1 may be connected to the first node N1 of the first output stage 320, and the source electrode of the first NMOS transistor NM1 may be connected to the third power line 173. For example, the drain electrode of the second NMOS transistor NM2 may be connected to the second node N2 of the first output stage 320, and the source electrode of the second NMOS transistor NM2 may be connected to the third power line 173.

The first input voltage VIN1 may be supplied to the gate electrode of the first NMOS transistor NM1, and the first output voltage OUT1 may be supplied to the gate electrode of the second NMOS transistor NM2.

The first level voltage VDDH1 may be greater than the second level voltage VDDH2, and the third level voltage VSSH may be less than the second level voltage VDDH2. For example, the second level voltage VDDH2 may be a value that is half the difference between the first level voltage VDDH1 and the third level voltage VSSH, but is not limited thereto. For example, the second difference value between the second level voltage VDDH2 and the third level voltage VSSH may be greater than or equal to the first difference value between the first level voltage VDDH1 and the second level voltage VDDH2. For example, the third level voltage VSSH may be a ground voltage. For example, the third level voltage VSSH may be a negative (−) voltage lower than the ground voltage.

The first input voltage VIN1 or the first output voltage OUT1 may be greater than the second level voltage VDDH2.

The first input voltage VIN1 or the first output voltage OUT1 greater than the second level voltage VDDH2 may be supplied to the gate electrode of the first conductivity type transistor NM1 and/or the second conductivity type transistor NM2. In addition, the third level voltage VSSH smaller than the second level voltage VDDH2 can be supplied to the source electrode of the first conductivity type transistor NM1 and/or the second conductivity type transistor NM2.

Therefore, even if the lower limit or a value close to the lower limit of the first input voltage VIN1 or the first output voltage OUT1 is supplied to the gate electrode of the first conductivity type transistor NM1 and/or the second conductivity type transistor NM2, since the difference between the first input voltage VIN1 or the first output voltage OUT1 and the third level voltage VSSH is large, the first conductivity type transistor NM1 and/or the second conductivity type transistor NM2 can be stably operated. Even if a value close to the lower limit or the lower limit or an upper limit or the upper limit of the first input voltage VIN1 or the first output voltage OUT1 is supplied as the gate voltage of the first conductivity type transistor NM1 and/or the second conductivity type transistor NM2, the first conductivity type transistor NM1 and/or the second conductivity type transistor NM2 can be operated stably. Accordingly, since the first conductivity type transistor NM1 and/or the second conductivity type transistor NM2 is operated stably over the entire range of the first input voltage VIN1 or the first output voltage OUT1, the gain characteristic or the offset characteristic can be improved.

Meanwhile, the conductivity type transistors NM1 to NM3 provided in the first input stage 310 may comprise flange type transistors having a large rated capacity. The channel width W of each of the conductivity type transistors NM1 to NM3 may be large. For example, compared to the channel width of each of the conductivity type transistors NM1 to NM3 and PM1 to PM3 provided in the first input stage 210 of the first embodiment (FIG. 5), the channel width of each of the conductivity type transistors NM1 to NM3 provided in the first input stage 310 of the third embodiment (FIG. 12) may be at least twice as large.

Figure 13:
FIG. 13 illustrates gain characteristics according to the first input voltage in a buffer according to the third embodiment.

As described above, in the buffer (200 of FIG. 5) according to the first embodiment, when the lower limit or a value close to the lower limit or the upper limit or a value close to the upper limit of the first input voltage VIN1 is supplied to the gate electrodes of the first conductivity type transistors NM1 and NM2, the gain value is significantly reduced (FIG. 7). However, as illustrated in FIG. 13, in the buffer according to the third embodiment (300 of FIG. 12), even if the lower limit or a value close to the lower limit or the upper limit or a value close to the upper limit of the first input voltage VIN1 is supplied as the gate voltage of the first conductivity type transistor NM1 and/or the second conductivity type transistor NM2, the gain value can maintain linearity. That is, since a constant gain value is obtained in the entire range between the lower limit and the upper limit of the first input voltage VIN1, the gain characteristics can be improved.

Figure 14:
FIG. 14 illustrates offset characteristics according to the first input voltage in a buffer according to the third embodiment.

In addition, in the buffer according to the first embodiment (200 of FIG. 5), when the lower limit or a value close to the lower limit or the upper limit or a value close to the upper limit of the first input voltage VIN1 is supplied to the gate electrodes of the first conductivity type transistors NM1 and NM2, it can be seen that the offset value is considerably large (FIG. 8). However, as illustrated in FIG. 14, in the buffer (300 of FIG. 12) according to the third embodiment, even if the lower limit or a value close to the lower limit or the upper limit or a value close to the upper limit of the first input voltage VIN1 is supplied as the gate voltage of the first conductivity type transistor NM1 and/or the second conductivity type transistor NM2, it can be seen that the offset value may be very low. That is, since a very low and constant offset value is obtained in the entire range between the lower limit and the upper limit of the first input voltage VIN1, the offset characteristic can be improved.

In this way, since the gain characteristics and offset characteristics are improved, the desired first output voltage OUT1 can be accurately output, so that the image quality can be improved when implementing the image.

Figure 15:
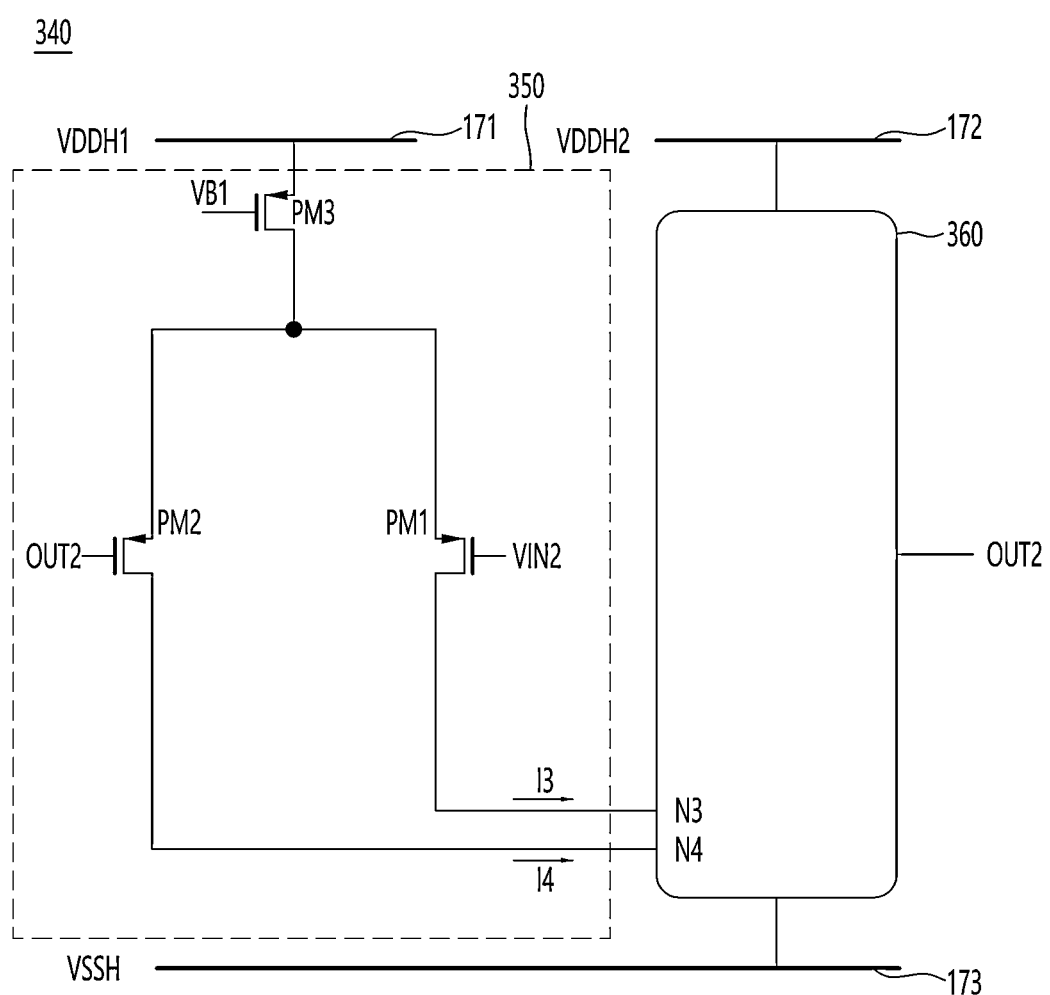
FIG. 15 illustrates a buffer according to the fourth embodiment.

FIG. 15 illustrates a buffer according to the fourth embodiment.

The fourth embodiment may be a second output adjustment unit that outputs a negative gamma voltage or a second output adjustment unit that outputs a negative data signal.

In the third embodiment (FIG. 12), a positive signal can be generated using a first input voltage VIN1, a first output voltage OUT1, a first level voltage VDDH1 supplied to a first power line 171, a second level voltage VDDH2 supplied to a second power line 172, and a third level voltage VSSH supplied to a third power line 173. In contrast, in the fourth embodiment (FIG. 15), a negative signal can be generated using the second input voltage VIN2, the second output voltage OUT2, the first level voltage VDDH1 supplied to the first power line 171, the second level voltage VDDH2 supplied to the second power line 172, and the third level voltage VSSH supplied to the third power line 173.

In addition, in the third embodiment (FIG. 12), the third power line 173 can be connected to the first input stage 310 and the second power line 172 can be connected to the first output stage 320. In contrast, in the fourth embodiment (FIG. 15), the first power line 171 can be connected to the second input stage 350 and the second power line 172 can be connected to the second output stage 360.

In the fourth embodiment, the same drawing symbols are given to components having the same functions as in the third embodiment (FIG. 12), and detailed descriptions are omitted.

Referring to FIG. 15, the buffer 340 according to the fourth embodiment may comprise a second input stage 350 and a second output stage 360.

The circuits comprised in the second input stage 350 and the circuits comprised in the second output stage 360 are the same as in the second embodiment (FIG. 9), and therefore detailed descriptions are omitted.

The second input stage 350 may be connected to the first power line 171. One side of the second output stage 360 may be connected to the second power line 172, and the other side of the second output stage 360 may be connected to the third power line 173. The first level voltage VDDH1 may be supplied to the first power line 171, the second level voltage VDDH2 may be supplied to the second power line 172, and the third level voltage VSSH may be supplied to the third power line 173. In an embodiment, the first difference value between the first level voltage VDDH1 and the second level voltage VDDH2 may be greater than or equal to the second difference value between the second level voltage VDDH2 and the third level voltage VSSH.

The second input stage 350 may adjust the control currents (I3, I4 of FIG. 6) according to the difference between the second input voltage VIN2 and the second output voltage OUT2. The control voltages HIP and HIN of the second output stage 360 can be adjusted according to the above-mentioned controlled control currents I3 and I4, so that the pull-up operation and/or the pull-down operation can be controlled.

The second input stage 350 may comprise an input unit, a bias circuit, etc. The input unit may comprise a third conductivity type transistor PM1 and a fourth conductivity type transistor PM2. The bias circuit may comprise a conductivity type transistor PM3. The conductivity type transistors PM1 to PM3 may comprise PMOS transistors.

The third conductivity type transistor PM1 and the fourth conductivity type transistor PM2 may be connected between the first power line 171 and the second output stage 360. The source electrode of the third conductivity type transistor PM1 may be connected to the first power line 171, and the drain electrode of the third conductivity type transistor PM1 may be connected to the third node N3 of the second output stage 360. The source electrode of the fourth conductivity type transistor PM2 may be connected to the first power line 171, and the drain electrode of the fourth conductivity type transistor PM2 may be connected to the fourth node N4 of the second output stage 360. The third conductivity type transistor PM1 may be controlled by the second input voltage VIN2, and the fourth conductivity type transistor PM2 may be controlled by the second output voltage OUT2. The source currents I3 and I4 may be adjusted according to the control of the third conductivity type transistor PM1 and/or the fourth conductivity type transistor PM2.

The conductivity type transistor PM3 may be connected between the first power line 171 and the input unit PM1 and PM2. For example, the conductivity type transistor PM3 can be controlled by the first bias voltage VB1. According to the control of the conductivity type transistor PM3, a bias current can be provided to the third conductivity type transistor PM1 and the fourth conductivity type transistor PM2. The source currents I3 and I4 can be adjusted by the bias current.

Meanwhile, the second output stage 360 can output the second output voltage OUT2 as a negative signal by using the voltage between the second level voltage VDDH2 supplied to the second power line 172 and the third level voltage VSSH supplied to the third power line 173. The second output stage 360 can output the second output voltage OUT2 as a negative signal by performing a pull-up or pull-down operation according to the adjusted control voltages HIP and HIN.

Meanwhile, the second input voltage VIN2 or the second output voltage OUT2 may be smaller than the second level voltage VDDH2. The first level voltage VDDH1 may be greater than the second level voltage VDDH2.

The second input voltage VIN2 or the second output voltage OUT2 smaller than the second level voltage VDDH2 may be supplied to the gate electrode of the third conductivity type transistor PM1 and/or the fourth conductivity type transistor PM2. In addition, the first level voltage VDDH1 greater than the second level voltage VDDH2 may be supplied to the source electrode of the third conductivity type transistor PM1 and/or the fourth conductivity type transistor PM2.

Therefore, even if an upper limit or a value close to the upper limit of the second input voltage VIN2 or the second output voltage OUT2 is supplied to the gate electrode of the third conductivity type transistor PM1 and/or the fourth conductivity type transistor PM2, since the difference between the second input voltage VIN2 or the second output voltage OUT2 and the first level voltage VDDH1 is large, the third conductivity type transistor PM1 and/or the fourth conductivity type transistor PM2 can be operated stably. Even if an upper limit or a value close to the upper limit of the second input voltage VIN2 or the second output voltage OUT2 is supplied as the gate voltage of the third conductivity type transistor PM1 and/or the fourth conductivity type transistor PM2, the third conductivity type transistor PM1 and/or the fourth conductivity type transistor PM2 can be operated stably. Thus, the third conductivity type transistor PM1 and/or the fourth conductivity type transistor PM2 can be stably operated over the entire range of the first input voltage VIN1 or the second output voltage OUT2. Therefore, the gain characteristics or the offset characteristics can be improved.

Meanwhile, the conductivity type transistors PM1 to PM3 provided in the second input stage 350 may comprise flange type transistors having a large rated capacity. The channel width W of each of the conductivity type transistors PM1 to PM3 may be large. For example, compared to the channel width of each of the first to sixth conductivity type transistors NM1 to NM3 and PM1 to PM3 provided in the second input stage 250 of the second embodiment (FIG. 9), the channel width of each of the conductivity type transistors PM1 to PM3 provided in the second input stage 350 of the fourth embodiment (FIG. 15) may be at least twice as large.

Figure 16:
FIG. 16 illustrates gain characteristics according to the second input voltage in a buffer according to the fourth embodiment.

As described above, in the buffer according to the second embodiment (240 of FIG. 9), when the lower limit or a value close to the lower limit or the upper limit or a value close to the upper limit of the second input voltage VIN2 is supplied to the gate electrodes of the second conductivity type transistors PM1 and PM2, the gain value is significantly reduced (FIG. 10). However, as illustrated in FIG. 16, in the buffer according to the fourth embodiment (340 of FIG. 15), even when the lower limit or a value close to the lower limit or the upper limit or a value close to the upper limit of the second input voltage VIN2 is supplied to the gate voltage of the third conductivity type transistor PM1 and/or the fourth conductivity type transistor PM2, the gain value can maintain linearity. That is, since a constant gain value is obtained in the entire range between the lower limit and the upper limit of the second input voltage VIN2, the gain characteristic can be improved.

Figure 17:
FIG. 17 illustrates offset characteristics according to the second input voltage in a buffer according to the fourth embodiment.

In addition, in the buffer according to the second embodiment (240 of FIG. 9), when the lower limit or a value close to the lower limit or the upper limit or a value close to the upper limit of the second input voltage VIN2 is supplied to the gate electrodes of the second conductivity type transistors PM1 and PM2, it can be seen that the offset value is considerably large (FIG. 11). However, as illustrated in FIG. 17, in the buffer according to the fourth embodiment (340 of FIG. 15), even when the lower limit or a value close to the lower limit or the upper limit or a value close to the upper limit of the second input voltage VIN2 is supplied to the gate voltage of the third conductivity type transistor PM1 and/or the fourth conductivity type transistor PM2, it can be seen that the offset value may be very low. That is, since a very low and constant offset value is obtained in the entire range between the lower limit and the upper limit of the second input voltage VIN2, the offset characteristic can be improved.

In this way, since the gain characteristics or offset characteristics are improved, the desired second output voltage OUT2 can be accurately output, so that the image quality can be improved when implementing the image.

The above detailed description should not be construed as limiting in all respects and should be considered illustrative. The scope of the embodiment should be determined by reasonable interpretation of the appended claims, and all changes within the equivalent range of the embodiment are comprised in the scope of the embodiment.

What is claimed is:

1. A buffer, comprising:
   a first output adjustment unit configured to output a first signal; and
   a second output adjustment unit configured to output a second signal,
   wherein the first output adjustment unit comprises:
   a first input stage configured to adjust a control current according to a difference between a first input voltage and a first output voltage; and
   a first output stage configured to output the first output voltage as the first signal,
   wherein the first output voltage is a voltage between a first level voltage and a second level voltage,
   wherein the first input stage is connected to a third power line that supplies a third level voltage,
   wherein the first level voltage is greater than the second level voltage,
   wherein the second level voltage is greater than the third level voltage, and
   wherein the first output stage comprises:
   a first side connected to a first power line that supplies the first level voltage; and
   a second side connected to a second power line that supplies the second level voltage.

2. The buffer of claim 1, wherein the first input stage comprises a first conductivity type transistor and a second conductivity type transistor,
   wherein a second electrode of the first conductivity type transistor and a second electrode of the second conductivity type transistor are respectively connected to a second node and a first node for controlling a pull-up operation, and
   wherein a third electrode of the first conductivity type transistor and a third electrode of the second conductivity type transistor are connected to the third power line.

3. The buffer of claim 2, wherein one of a first electrode of the first conductivity type transistor and a first electrode of the second conductivity type transistor is input with the first input voltage, and
   wherein the other of the first electrode of the first conductivity type transistor and the first electrode of the second conductivity type transistor is input with the first output voltage.

4. The buffer of claim 3, wherein the first input voltage or the first output voltage is greater than the second level voltage.

5. The buffer of claim 2, wherein the first conductivity type transistor and the second conductivity type transistor comprise NMOS transistors.

6. The buffer of claim 1, wherein a second difference value between the second level voltage and the third level voltage is greater than or equal to a first difference value between the first level voltage and the second level voltage.

7. The buffer of claim 1, wherein the second output adjustment unit comprises:
   a second input stage configured to adjust a control current according to a difference between a second input voltage and a second output voltage; and
   a second output stage configured to output the second output voltage as the second signal,
   wherein the second output voltage is a voltage between the second level voltage and the third level voltage, and
   wherein the second input stage is connected to the first power line that supplies the first level voltage.

8. The buffer of claim 7, wherein the second output stage comprises:
   a first side connected to the second power line that supplies the second level voltage; and
   a second side connected to the third power line that supplies the third level voltage.

9. The buffer of claim 8, wherein the second input stage comprises a third conductivity type transistor and a fourth conductivity type transistor,
   wherein a second electrode of the third conductivity type transistor and a second electrode of the fourth conductivity type transistor are respectively connected to a third node and a fourth node for controlling a pull-down operation, and wherein a third electrode of the third conductivity type transistor and a third electrode of the fourth conductivity type transistor are connected to the first power line.

10. The buffer of claim 9, wherein one of a first electrode of the third conductivity type transistor and a first electrode of the fourth conductivity type transistor is input with the second input voltage, and
wherein the other of the first electrode of the third conductivity type transistor and the first electrode of the fourth conductivity type transistor is input with the second output voltage.

11. The buffer of claim 10, wherein the second input voltage or the second output voltage is smaller than the second level voltage.

12. The buffer of claim 9, wherein the third conductivity type transistor and the fourth conductivity type transistor comprise PMOS transistors.

13. The buffer of claim 7, wherein a first difference value between the first level voltage and the second level voltage is greater than or equal to a second difference value between the second level voltage and the third level voltage.

14. A data driving device, comprising:
a digital-to-analog converter configured to convert digital data into an analog data signal; and
an output buffer unit comprising a buffer for each output channel configured to buffer and output the analog data signal,
wherein the output buffer unit comprises:
a first output adjustment unit configured to output a first signal; and
a second output adjustment unit configured to output a second signal,
wherein the first output adjustment unit comprises:
a first input stage configured to adjust a control current according to a difference between a first input voltage and a first output voltage; and
a first output stage configured to output the first output voltage as the first signal,
wherein the first output voltage is a voltage between a first level voltage and a second level voltage,
wherein the first input stage is connected to a third power line that supplies a third level voltage,
wherein the first level voltage is greater than the second level voltage,
wherein the second level voltage is greater than the third level voltage, and
wherein the first output stage comprises:
a first side connected to a first power line that supplies the first level voltage; and
a second side connected to a second power line that supplies the second level voltage.

15. The data driving device of claim 14, wherein the first input voltage or the first output voltage is greater than the second level voltage, and
wherein a second difference value between the second level voltage and the third level voltage is greater than or equal to a first difference value between the first level voltage and the second level voltage.

16. The data driving device of claim 14, wherein the second output adjustment unit comprises:
a second input stage configured to adjust a control current according to a difference between a second input voltage and a second output voltage; and
a second output stage configured to output the second output voltage as the second signal;
wherein the second output voltage is a voltage between the second level voltage and the third level voltage, and
wherein the second input stage is connected to the first power line that supplies the first level voltage.

17. The data driving device of claim 16, wherein the second input voltage or the second output voltage is smaller than the second level voltage, and
wherein a first difference value between the first level voltage and the second level voltage is greater than or equal to a second difference value between the second level voltage and the third level voltage.

18. A data driving device, comprising:
a gamma voltage circuit comprising a plurality of gamma buffers, each of which is configured to buffer and output a plurality of reference gammas;
a digital-to-analog converter configured to convert digital data into an analog data signal based on the plurality of reference gammas; and
an output buffer unit comprising a channel buffer for each output channel configured to buffer and output the analog data signal,
wherein one of the gamma buffers and the channel buffers comprises:
a first output adjustment unit configured to output a first signal; and
a second output adjustment unit configured to output a second signal,
wherein the first output adjustment unit comprises:
a first input stage configured to adjust a control current according to a difference between a first input voltage and a first output voltage; and
a first output stage configured to output the first output voltage as the first signal,
wherein the first output voltage is a voltage between a first level voltage and a second level voltage,
wherein the first input stage is connected to a third power line that supplies a third level voltage,
wherein the first level voltage is greater than the second level voltage, and
wherein the second level voltage is greater than the third level voltage.

19. The data driving device of claim 18, wherein the second output adjustment unit comprises:
a second input stage configured to adjust a control current according to a difference between a second input voltage and a second output voltage; and
a second output stage configured to output the second output voltage as the second signal,
wherein the second output voltage is a voltage between the second level voltage and the third level voltage, and
wherein the second input stage is connected to a first power line that supplies the first level voltage.

20. The data driving device of claim 18, wherein the first output stage comprises:
a first side connected to a first power line that supplies the first level voltage; and
a second side connected to a second power line that supplies the second level voltage.

* * * * *